United States Patent [19]

Rudolph

[11] Patent Number: 4,697,156
[45] Date of Patent: Sep. 29, 1987

[54] DIGITALLY CONTROLLED VARIABLE FREQUENCY SYNTHESIZER

[75] Inventor: Georg Rudolph, Eningen, Fed. Rep. of Germany

[73] Assignee: Wandel u. Goltermann GmbH & Co., Eningen, Fed. Rep. of Germany

[21] Appl. No.: 941,184

[22] Filed: Dec. 12, 1986

[30] Foreign Application Priority Data

Dec. 14, 1985 [DE] Fed. Rep. of Germany ....... 3544371

[51] Int. Cl.$^4$ .......................................... H03L 7/18
[52] U.S. Cl. ..................................... 331/1 A; 331/16; 331/25
[58] Field of Search ................ 331/1 A, 10, 16, 17, 331/25; 455/183, 260

[56] References Cited

U.S. PATENT DOCUMENTS

4,573,023  2/1986  Cok et al. .......................... 331/1 A

*Primary Examiner*—Eugene R. LaRoche
*Assistant Examiner*—Robert J. Pascal
*Attorney, Agent, or Firm*—Karl F. Ross; Herbert Dubno

[57] ABSTRACT

In a generator whose frequency can be set digitally and connected in a phase-locked loop (PLL) with a frequency divider whose frequency divider ratio is periodically changed, the sum of the phase errors, which are the phase deviations of the individual frequency-divider delivered pulses from the phase of the reference frequency, is calculated and each pulse for which the phase-error sum exceeds a predetermined value is delayed by a time period corresponding to this value before being fed to the phase meter or phase detector of the phase-locked loop. As a result, any drift or oscillatory fluctuations of the voltage-controlled oscillator (VCO) control voltage are confined to substantially high frequencies and only very weak subharmonic components, and the oscillatory fluctuations can be filtered out easily by a low-pass filter between the phase detector or phase meter and the control-voltage input of the VCO. Also the generation of a compensating voltage is possible using digital means at low cost and with the result that high stability and accuracy of the selected output frequency can be ensured.

18 Claims, 7 Drawing Figures

DIGITALLY CONTROLLED VARIABLE FREQUENCY SYNTHESIZER

FIELD OF THE INVENTION

Our present invention relates to a synthesizer, i.e. an electronic device outputting a selectable frequency, and more particularly to a digitally controlled frequency selection synthesizer which is provided with phase-error summing compensation.

BACKGROUND OF THE INVENTION

In the German Pat. No. 22 40 216, there is described a digitally controlled variable frequency synthesizer using a phase-locked loop circuit for control of the electronically tunable oscillator, namely the voltage-control oscillator whose output is at a frequency fa controlled by a selection input FA applied to a logic and arithmetic circuit (ALU).

While that circuit is described in greater detail below, it can be pointed out that it basically comprises a frequency divider which receives an input fa from the electronically tunable or voltage-controlled oscillator and has its division ratio m controlled by the ALU.

The output from the frequency divider is applied to a phase detector or phase meter which also receives a reference frequency fr from a fixed-divisor frequency divider supplied by a crystal-controlled, fixed-value or reference oscillator. A crossover switch can, both for the invention and its earlier circuit, be used to apply the output of the fixed-value oscillator to the loop for calibration purposes.

The output of the phases detector is ultimately applied as a control voltage to the control-voltage input of the voltage controlled oscillator or VCO.

The ALU in this circuit allows control of the dividing ratio of the variable frequency divider so that output frequency fa of the VCO can be selected in response to the value of FA. Experience with this circuit has shown, however, that there is a tendency for the output voltage of the phase detector to fluctuate or oscillate in a sawtooth manner in a way which cannot be fully eliminated by feeding the output of the phase detector through a low-pass filter to the control input of the VCO.

As a consequence, the output of the VCO can vary in an undesirable manner, the frequency resolution of the circuit may be limited and the frequency level of the reference frequency source can be limited, thereby adversely affecting the range of the synthesizer output.

OBJECTS OF THE INVENTION

It is therefore the principal object of the present invention to provide an improved digitally controlled frequency source or synthesizer which, while of the phase-locked loop type of the earlier system, nevertheless allows a higher reference frequency to be used and affords greater frequency resolution.

It is another object of our invention to provide an improved electronically tunable synthesizer, using phase-error summing principles for control of an electronically tunable oscillator but which also facilitates filtering of perterbations from the signal delivered to the control input of the VCO.

Still another object of this inveniton is to provide an improved electronically controllable synthesizer with summing compensation which, at low cost and in a particularly convenient and elegant manner provides compensating voltages for the input to the VCO which eliminates the need for other sources of such compensating voltages.

SUMMARY OF THE INVENTION

According to the invention, in a generator whose frequency can be set digitally and connected in a phase-locked loop (PLL) with a frequency divider whose frequency divider ratio is periodically changed, the sum of the phase errors, which are the phase deviations of the individual frequency-divider delivered pulses from the phase of the reference frequency, is calculated and each pulse for which the phase-error sum exceeds a predetermined value is delayed by a time period corresponding to this value before being fed to the phase meter or phase detector of the phase-locked loop. As a result, any drift or oscillatory fluctuations of the voltage-controlled oscillator (VCO) control voltage are confined to substantially high frequencies and only very weak subharmonic components, and the oscillatory fluctuations can be filtered out easily by a low-pass filter between the phase detector or phase meter and the control-voltage input of the VCO. Also the generation of a compensating voltage is possible using digital means at low cost and with the result that high stability and accuracy of the selected output frequency can be ensured.

In specific structural terms, therefore, the invention makes use of a first branching or resolving circuit which can, from the ratio of the desired frequency FA to the reference frequency fr (FA:fr) resolves the resulting quotient m' into its integral component mI and its fractional component mF, the latter component being applied together with a prior value of a fractional component to an adder which, in turn feeds a second branching or resolving circuit at which this other fractional component is formed together with an integral component used to control a pulse adder or subtractor coupled ahead of the variable frequency divider which receives the integral component mI. The ALU of the present invention can also include a third branching and resolution circuit as well as an adder receiving inputs from the last two resolving circuits for summing the fractional components generated thereby.

The result is a summing compensation which will be detailed further below.

According to the invention, therefore, a digitally selectable synthesizer or frequency generator can comprise:

a voltage-controlled oscillator having an output emitting an output signal of a frequency fa controlled in response to a signal applied to a control input of the oscillator;

a loop filter connected to the control input for applying a signal thereto to control the output frequency fa of the oscillator;

a phase detector connected to the loop filter for supplying a control signal thereto for application to the control input, the phase detector having two inputs;

a reference-frequency source connected to one of the inputs of the phase detector for applying a high-precision reference frequency signal fr thereto;

a variable frequency divider ratio divider connected to the output and receiving the output signal of frequency fa therefrom and dividing the frequency fa by a variable frequency divider ratio m to provide a divided-frequency output which is applied to the other of the inputs of the phase detector, the frequency divider, the phase detector and the loop filter forming a phase-locked loop with the voltage-controlled oscillator, the phase detector having a tendency to sawtooth output fluctuations causing frequency drift of the oscillator;

means for determining a generally mixed-number division ratio m′ from a ratio of a desired output frequency FA and the frequency fr, where fa ideally is to equal FA and resolving the ratio m′ into a whole-number component mI which is applied to the divider to set the frequency divider ratio m thereof and a fractional component mF;

means for forming a first sum S1 from the fractional component mF and another fractional component S1F derived by resolving the first sum S1 into the other fractional component S1F and a whole-number component S1I;

means for forming a second, phase-error, sum S2=S2I+S2F in the cadence of the output of the divider by adding the fractional component S1F′ resolved from the first sum of a preceding cycle period and a fractional component S2F′ resolved from the second sum in a preceding cycle period, the second sum being defined by S2=S1F′+S2F and being resolved into a second-sum fractional component S2F and a second-sum whole-number component S2I; and a phase shifter connected between the divider and the phase detector or phase meter and controlled by the second-sum whole-number component S2I to compensate for the tendency and stabilize the output frequency of the oscillator.

According to a feature of the invention, the phase shifter effects a delay of a pulse outputted by the divider by the fixed phase value S2I when the determined phase-error sum attains or exceeds this latter fixed phase value.

In a particular feature of this invention, a pulse appearing at the output of the divider will be delayed by p·Ta when the whole-number component S2I has the value p and the pulse appearing at the output of the divider is not delayed when S2I is zero (null). In the foregoing relationship, p is a whole number or integer and Ta=1/fa.

The adjustable phase shifter can comprise a multi-stage shift register clocked in the cadence of the output frequency fa of the oscillator, and a reversing switch which selectively commutates the input of the phase detector or phase meter (which communicates with the phase shifter) to the outputs of either of two stages of the shift register spaced apart by the value p. The logic and arithmetic unit (ALU) can then be so connected to the reversing switch as to set the phase shifter to its lower value when the second or phase-error sum is less than the predetermined phase value p2π, and to set the phase shifter to its greater value (increased by p2π over the lower value), when the second sum S2 attains or exceeds the predetermined phase value.

According to another feature of the invention, the ALU, in order to delay a pulse delivered by the frequency divider to the input of the phase detector or phase meter which normally has a frequency divider ratio m. has its frequency divider ratio mI or mI+1 as determined by the whole-number component S1I of the first sum S1, respectively once increased during the first of two successive period of the divider output frequency ft by one unit or increment, and decreased during the second of these periods by one unit or increment (mI+1 and mI−1 or mI+2 and mI).

In another embodiment of the invention, the mixed-number component or fractional component S1F′ of the first sum S1′ extracted in the preceding cycle period is quantized with a step height b1 (S1F′=Q1I+Q1F=-Q1I+S1F mod b1). The second sum S2 can be formed from the first step value Q1I and the mixed-number component or fractional component S2F′ of the second sum S2′ extracted in the second cycle period. The first remainder (residue) Q1F is quantized with the step height b2 (Q1F=Q2I+Q2F=Q2I+Q1F mod b2). A third sum S3 can be formed in the cadence of the output of the output pulses appearing at the output of the frequency divider from the second step value Q2I, the first remainder Q1F and a third mixed-number component S3F′ resolved from the preceding cycle period and the third sum S3 thereof. The third whole-number component S3I which also results from the resolution of the third sum S3 is used to form an analog voltage $U_{K1}$ proportional thereto and is supplied as a compensating voltage to the control-voltage input of the VCO together with the control voltage $U_{st}$.

In the latter embodiment, the second remainder or residue Q2F can be quantized with the step height b3 (Q2F=Q3I+Q3F=Q3I+Q2F mod b3). A fourth sum S4 is formed in the cadence of the pulses appearing at the output of the frequency divider from the third step value Q3I, the second remainder or residue Q2F, and a fourth mixed-number component or fractional component S4F′ which, in turn, is formed in a preceding cycle period by resolving the fourth sum S4 into a fourth whole-number component S4I and a fourth mixed-number component or fractional component S4F. An analog voltage $U_{K2}$ is formed proportional to the fourth whole-number component S4I and can be fed as a compensating voltage together with the analog voltage $U_{K1}$ and the control voltage $U_{st}$ to the electronically tunable oscillator.

In the last-mentioned embodiment, moreover, the control input of the variable frequency divider ratio frequency divider can be supplied through an adder which can vary the divider ratio m among a multiplicity of values.

When the divider can be set selectively to a value m=mI as has been described, I may provide at the frequency-signal input to the divider a pulse subtractor or pulse adder (controllable pulse value adjuster) which is activated when the whole-number component S1I has the value p.

In the latter case, between the output of the first branching or resolving circuit for the whole-number component S1I of the first sum S1 and the input to the pulse subtractor, or the input to an adder connected to the control input of the divider, a further clocked intermediate storage (e.g. a D-flipflop) can be provided which is clocked in the cadence of the output pulses from the frequency divider, i.e. at the frequency ft. A constant value D can, if desired, be added to the second sum S2.

BRIEF DESCRIPTION OF THE DRAWING

The above and other objects, features and advantages of the present invention will become more readily apparent from the following description, reference being made to the accompanying drawing in which.

SPECIFIC DESCRIPTION

Figure 1:
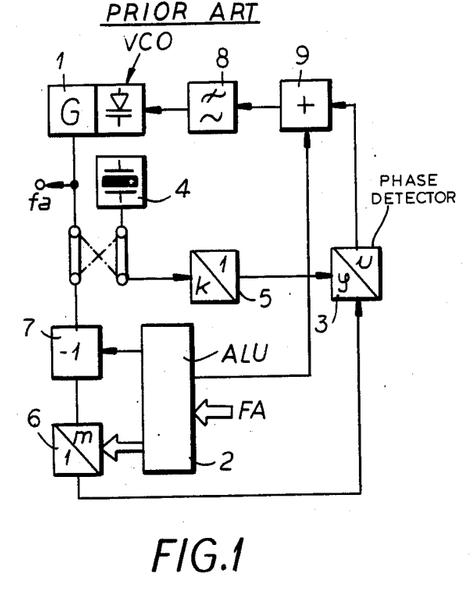
FIG 1 is a circuit diagram in block form representing the prior art system of German Pat. No. 22 40 216.

FIG. 1 shows a simplified circuit diagram of the prior-art generator described, for example, in German patent document No. 2,240,216.

The output frequency fa is generated by a voltage controlled oscillator (VCO) 1 in a phase-spotted frequency-control loop (PLL) in accordance with frequency information FA which can be supplied to a logic and arithmetic circuit (ALU) 2.

The control voltage $U_{st}$ for the VCO 1 is supplied by a phase meter or phase detector 3 supplied with a reference frequency fr by a fixed-ratio frequency divider 5 supplied by a standard-frequency source 4 (here shown as a crystal-controlled oscillator). The other input to the phase meter or phase detector 3 is a frequency which is coordinated timewise with the output frequency fa of the oscillator 1. This other input represents the output fa after it has been processed through a variable dividing ratio frequency divider 6 having an integral (whole-number) dividing ratio m. Ahead of the frequency divider 6, a pulse subtractor 7 is provided to suppress upon each excitation by a control pulse, one period (one pulse) of the pulse train delivered by the output of the oscillator 1 so that the combination of subtractor and divider 6,7 has the effect of providing a division transfer function with a ratio of 1/(m+1).

The logic and arithmetic circuit 2 controls the frequency divider 6 in response to its input frequency information FA and activates the pulse subtractor 7, in timed relationship to the output of the divider 6, so that a mixed-number frequency division ratio m' is formed between m and m+1, where m'=fa:fr.

This results in slow fluctuation of the VCO control voltage and, consequently, slow fluctuations in the output frequency fa (spurious signals) which can only be extracted by filtering the VCO control voltage by a loop filter 8 at the expense of a long build-up time upon a frequency change or costly compensation of the control voltage fluctuations by a compensating voltage $U_k$ which must then be generated by the logic and arithmetic circuit 2 and is combined with the output of the phase meter or phase detector 3 by an analog adder 9 in the phase locked loop control circuit before the control voltage is fed to the VCO 1.

Figure 2:
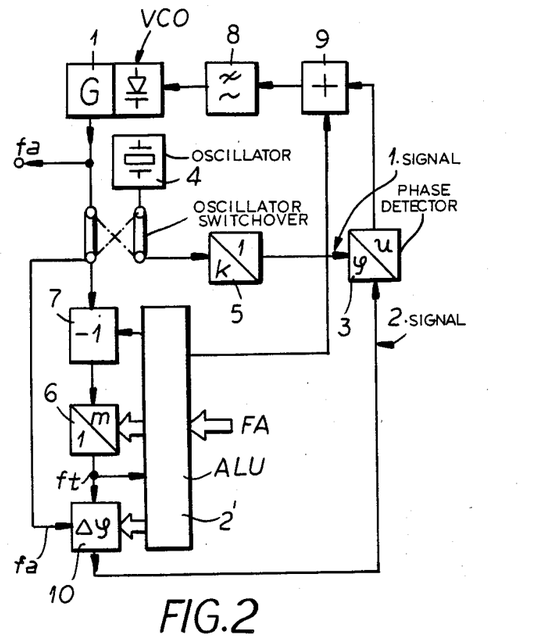
FIG. 2 is a block diagram similar to that of FIG. 1 but illustrating the circuit of the invention.

FIG. 2 is a diagram similar to that of FIG. 1, but illustrating the principles of the present invention. The differences between the circuit of FIG. 1 and that of the invention (FIG. 2) lie primarily in the provision of a differently constructed and differently operating logic and arithmetic circuit (ALU) 2', and in the provision of a phase shifter or pulse delay circuit 10. The latter is inserted between the output of the adjustable frequency divider 6 and the input of the phase meter or phase detector 3, and is controlled by the logic and arithmetic circuit 2' as will be described in connection with FIG. 3.

Figure 3:
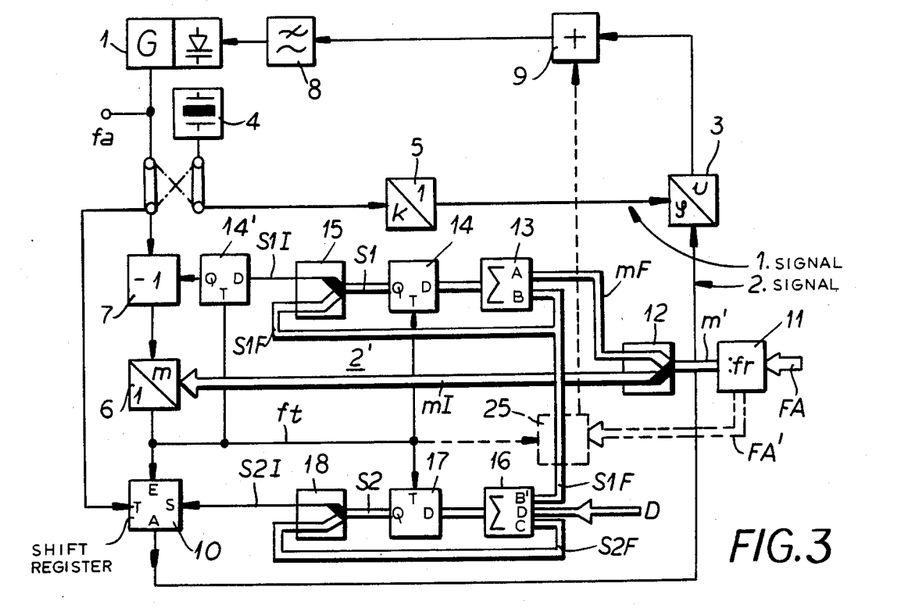
FIG. 3 is partly a block diagram of partly an information flow diagram for the circuit of FIG. 2 but showing the logic and arithmetic unit (ALU) thereof in greater detail.

The block diagram of FIG. 3 shows the principles of operation of the logic and arithmetic circuit 2' of FIG. 2 in somewhat greater detail. The logic and arithmetic circuit 2' comprises an input port 11 for information input and preparation and to which the frequency selection information FA is inputted. The output of the input port 11 is applied to the branching (fraction-extraction or resolving) circuit 12 and then to two circuit groups operated synchronously by timing (clock) signals from a common source.

Each of the circuit groups includes a respective adder 13, 16, an intermediate storage (register, buffer) 14, 17, and a further branching or fraction-extraction (resolving) circuit 15, 18 comprised of a quantizer with a step height of unity. The two circuit groups form true (real) sums S1 and S2 using the mixed-number (or fractional) sum component S1F and S2F derived from the previous cycle. (The same also applies to the corresponding circuit groups of FIGS. 5 and 7.)

The information FA as to the desired output frequency fa is inputted to the input port 11 at which a division by the reference frequency fr is effected to define the mixed-number frequency ratio m' (m'=fa:fr), the reference frequency fr being derived as previously described from a reference-frequency oscillator 4 through a fixed-ratio frequency divider 5.

The branching circuit 12 breaks m' down into two components, namely a whole-number component mI to which the frequency-division ratio m of the frequency divider 6 is set, and a mixed-number component mF by which a transitory switchover of the frequency-divider combination to a frequency-divider ratio of m+1 is effected.

To this end, the first sum S1 in the intermediate store 14 is subdivided in the branching circuit 15 into a mixed-number (or fractional) component S1F and a whole-number (or integer) component S1I (S1=S1F+S1I). If the whole-number value S1I=1, the pulse subtractor is enabled to deduct a pulse coming from the oscillator 1 so that in the respective cycle period the frequency-dividing ratio m=mI+1 is effective. If, however, during this cycle period S1I=0, the frequency-dividing ratio during this period will remain m=mI.

The first sum S1 standing in the intermediate storage 14 in a given cycle period is formed in the previous cycle period by the adder 13 from the mixed-number component mF of the required frequency-divider ratio m' and the mixed-number component S1F determined in this preceding cycle period, this first sum S1 being applied to the input of the intermediate storage 14 and being delivered at the output upon the arrival of the cycle.

The second adding and branching circuit 16, 17, 18 functions similarly. It forms the second sum S2 from the mixed-number component S2F appearing at it in the preceding cycle period and from the mixed-number component S1F arriving at this circuit from the first adding and branching circuit 13, 14, 15 during this preceding cycle period. The second adding and branching circuit 16, 17, 18 breaks this second sum S2 into a mixed-number component S2I and the mixed-number component S2F and enables at S2I=1 the phase shifter 10 clocked at the output frequency fa. The logic and arithmetic unit (ALU) 2' triggers a switch of the phase shifter 10 so that this circuit will have its low value when the whole-number component S2I of the second sum S2 is zero, and brings the phase shifter to its high value when the whole-number component S2I is equal to unity (S2I=1), whereby the variation corresponds to one cycle period 1:fa of the output frequency fa.

The first embodiment of the invention, as illustrated in FIG. 3, can be modified in that the step height of the branching circuit of the second clocked circuit group 16, 17, 18 has the value p (where p is a whole number greater than or equal to unity, p 1) In this case S2I is either equal to 0 when S2 is less than p (S2<p), or is equal to unity (1) when S2 p. The phase shifter is thus effective upon actuation (S2I=1) to provide a p-fold delay of the pulses applied to the phase meter or phase detector 3 (delay of p/fa, corresponding to p periods of the output frequency fa).

In a further modification of the first embodiment a constant value D is added to the components forming the second sum S2 in the adder (input D in FIG. 3). Since the spectral distribution of the high-frequency noise lines produced by the phase shifter 10 are dependent upon the phase position of the triggering pulse, after the selection of the desired output frequency, this addition of the constant D can be advantageous.

Figure 5:
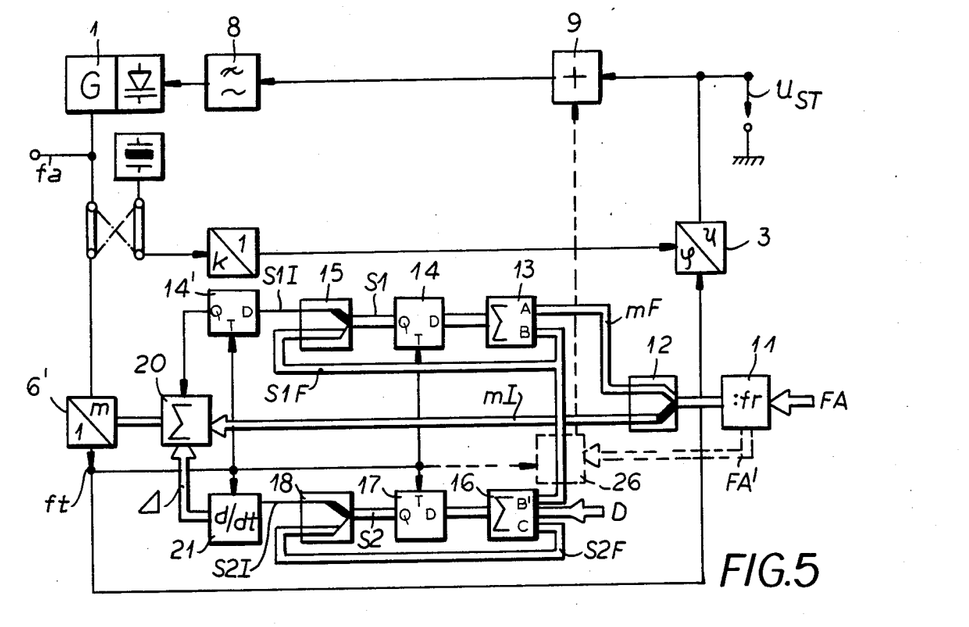
FIG. 5 is a circuit diagram also similar to FIG. 3 in which an adder is provided for the input of the variable frequency divider.

Another modification of the arrangement shown in FIG. 3 and FIG. 5 provides for the compensation or equalization of the transit-time differences between the two adding and branching circuits 13, 14, 15 and 16, 17, 18 by the introduction of a further clocked intermediate store 14' between the output of the branching circuit 15 for the whole-number component S1I and the input to the pulse subtractor 7 (FIG. 3) or the input to the adder 20 (FIG. 5).

Figure 4:
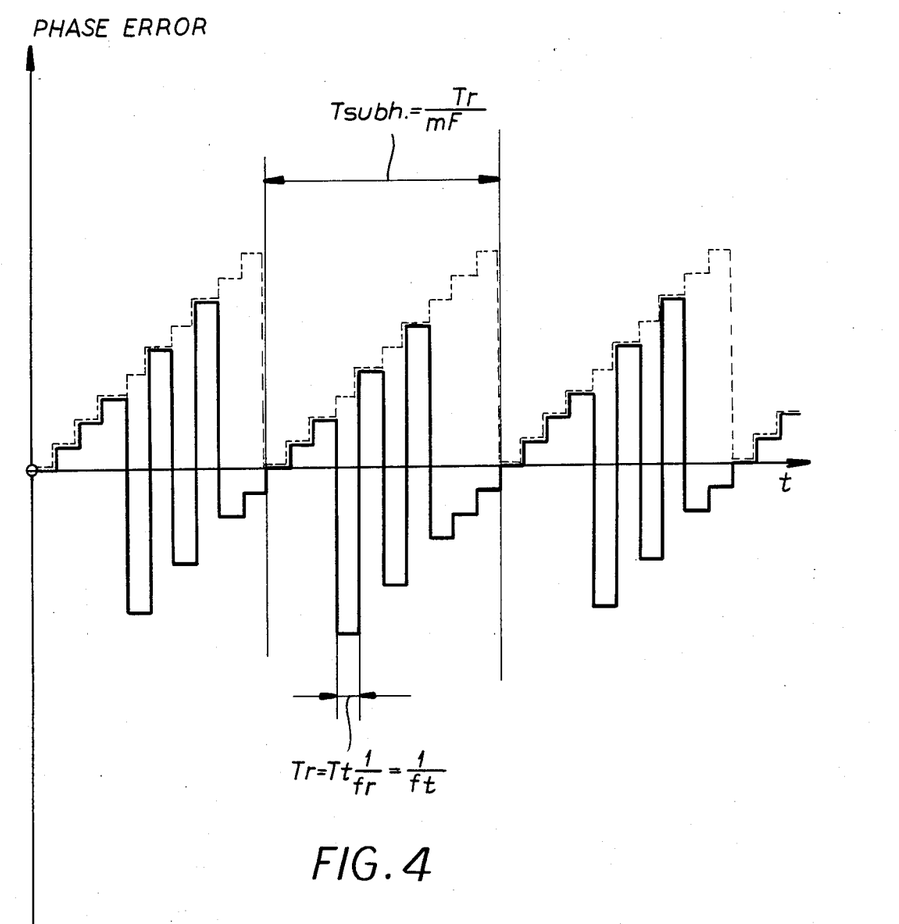
FIG. 4 is a diagram in which the phase error is plotted along the ordinate versus time along the abscissa and thus illustrating the phase error of the voltage supplied to the phase detector by the shift register constituting the phase shifter of the invention.

In FIG. 4 the phase error is plotted in terms of its voltage characteristic along the ordinate vs time along the abscissa. This FIG. shows the phase error between the unfiltered VCO-control voltage outputted by the phase meter or phase detector 3 and the pulses applied at the input to the phase meter.

In the example illustrated, it is accepted that the mixed-number component mF of the mixed-number frequency divider ratio fa:fr=mI+mF is equal to one tenth of the reference frequency fr, which corresponds to the stepping of the output frequency fa upon a change in the whole-number frequency divider ratio mI by one unit, and that the starting levels or values in the intermediate stores 14, 17 are both zero (null).

For example, with fa=14.1 MHz and fr=1 MHz, the value of mI=14 and the value of mF=0.1=1:10. Without the effect of the second clocked circuit group 16, 17, 18, which actuates the phase shifter 10, the broken-line characteristic 19 would result, i.e. a very low frequency voltage fluctuation which is subharmonic to the cycle frequency ft. Upon activation of the phase shifter 10 through the second clocked circuit group 16, 17, 18, which always happens when S2I=1 (or S2I=p), the solid-line voltage characteristic is obtained of the output voltage of the phase meter, which contains higher-frequency components and thus can be smoothed more easily than the beats or surges 19.

The second embodiment of the invention, shown in FIG. 5, differs from the arrangement shown in FIG. 3 in that it does not have a special phase shifter and that the frequency divider ratio m of the frequency divider 6' is continuously and speedily readjusted. This continuous rapid readjustment is effected by an adder 20 which receives, on the one hand, the whole-number component mI of the frequency divider ratio m' and, on the other hand, the whole-number value S1I of the first sum S1 and, in addition, the differential Δ of the whole-number value S2I of the second sum S2 which is supplied by a differentiating circuit 21.

This differential is zero (null) when the whole-number value S2I of the second sum S2 does not jump at the beginning of a new cycle period (i.e. remains at a value 0 or at a value ), and is +1 or −1 when S2I has a positive jump (i.e. from a value of 0 to a value of 1) or a negative jump (i.e. from a value of 1 to a value of 0). The differentiator circuit can thus apply one of three values (−1, 0, +1) to the adder 20 and the latter can, depending upon the whole-number component S1I of the first sum, output the value 0 or the value 1 to set the frequency divider to one of four different values (m−1, m, m+1, and m+2). The third of the summed components, namely the differential Δ does not alter in a time-wise manner the mean frequency divider ratio m' determined by the two earlier-mentioned sum components, but only a phase shift of a pulse appearing at the output of the frequency divider 6'.

Figures 6, 7:
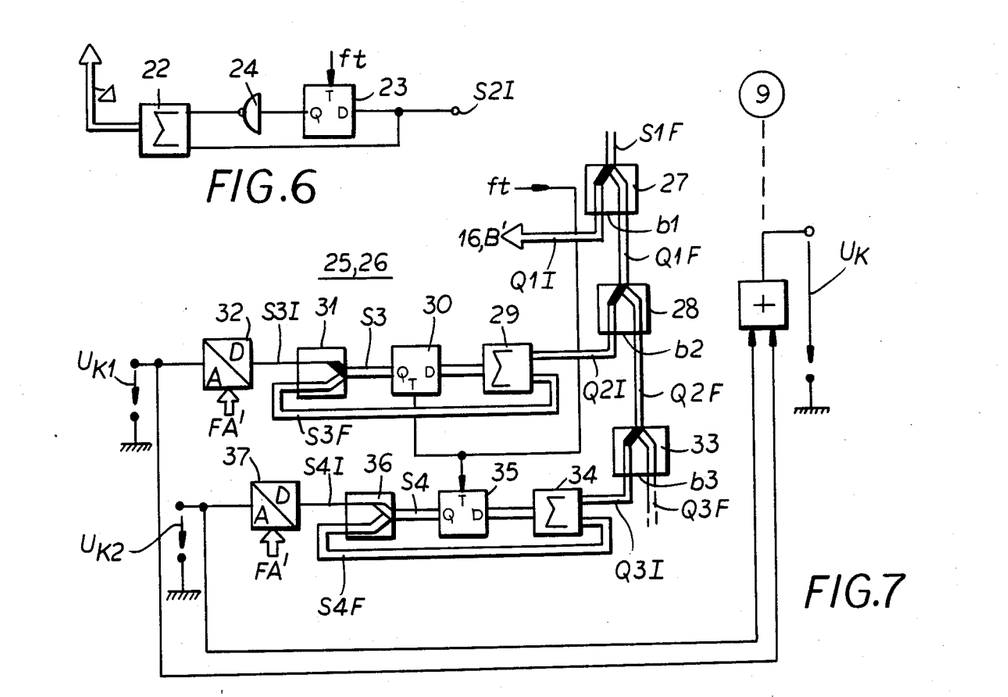
FIG. 6 is a diagram of the circuit developing the differential fed to the latter adder.
FIG. 7 is a diagram illustrating the formation of compensating voltages for use in the circuits of FIGS. 3 and 5.

FIG. 6 shows the differentiator 20 of FIG. 5 and which can be seen to include an adder 22 at the output of which the differential Δ appears. The whole-number component S2I of the second sum S2 is applied directly to a first input of the adder 22 and to an input of a D-flipflop 23 clocked at the frequency ft. An inverting circuit 24 negates the output signal Q and applies it to the second input of the adder 22.

A fourth and a fifth embodiments of the invention can result from the addition of the components shown in broken lines in FIG. 3 or FIG. 5 and which serve to generate a compensating voltage $V_K$. These circuit elements 25 or 26 are seen in block-diagram form in FIG. 7.

In both cases, between the input B of the adding circuit 13, to which the the mixed-number component S1F is fed from the branching or fraction-extraction circuit 15, and the input B' of the adding circuit 16, a first quantizing circuit 27 is connected. This circuit 27 quantizes the mixed-number component S1F of the first sum S1F obtained in the preceding cycle period with the step height b1 (S1F=Q1I+Q1F=Q1F+S1F mod b1) and conducts the first step value Q1I for the formation of the second sum S2 to the input B' of the adder 16 and the first remainder Q1F to a second quantizing circuit 28.

The second quantizing circuit 28 quantizes the mixed-number component Q1F with the step height b2 (Q1F=Q2I+Q2F=Q2I+Q1F mod b2) and conducts the second step value Q2I for formation of a third sum S3 to a third adder and branching or fraction extraction unit 29, 30, 31. This circuit forms the third sum S3 from the mixed-number component S3F arriving at the circuit 29, 30, 31 in the preceding cycle period and from the second step value Q2I from the preceding cycle period. This sum is resolved or extracted in the branching circuit or fraction extractor 31 into the third mixed-number component S3F and a third whole-number component S3I. From the latter a digital/analog converter develops a proportional analog voltage Uk1 which is fed as part of the compensating voltage together with the control voltage the the electronically tunable oscillator 1.

The second remainder Q2F from the second quantization is fed to a third quantizing circuit 33 with a step height b3 which transforms it into a third remainder Q3F, which is not processed further in the embodiment of FIG. 5, and a third step value Q3I.

In a fourth adding and branching or fraction extraction circuit group 34, 35, 36, similar to the third group, the fourth mixed-number component S4F arriving from the preceding cycle period and the third step value Q3F also from the preceding cycle period are combined to a fourth sum S4. This sum is resolved into the fourth mixed-number component S4F and a fourth whole-number component S4I. The latter is transformed into a further proportional analog voltage Uk2 in a second digital/analog converter 37. The two analog voltages Uk1 and Uk2 are each frequency-weighted and together with the control voltage Ust outputted by the phase meter 3 are applied to control the electronicallu tunable oscillator 1.

The circuit components 28-37 collectively form digital/analog conversion circuitry which, at a modest increase in cost on the digital side, can greatly reduce the cost of compensation circuitry on the analog side. The mixed-number component Q1F is highly broken up and is transmitted over many parallel paths, while for the transmission of the whole-number components S3I and S4I only a single path, each, is required because they need handle only binary signals, so that the D/A converters can be especially simple.

I claim:

1. A signal generator or synthesizer with digital frequency setting, comprising:
    a voltage-controlled oscillator having an output emitting an output signal of a frequency fa controlled in response to a signal applied to a control input of said oscillator;
    a loop filter connected to said control input for applying a signal thereto to control the output frequency fa of said oscillator;
    a phase detector connected to said loop filter for supplying a control signal thereto for application to said control input, said phase detector having two inputs;
    a reference-frequency source connected to one of said inputs of said phase detector for applying a high-precision reference frequency signal fr thereto;
    a variable frequency divider ratio divider connected to said output and receiving said output signal of frequency fa therefrom and dividing said frequency fa by a variable frequency divider ratio m to provide a divided-frequency output which is applied to the other of said inputs of said phase detector, said frequency divider, said phase detector and said loop filter forming a phase-locked loop with said voltage-controlled oscillator, said phase detector having a tendency to sawtooth output fluctuations causing frequency drift of the oscillator;
    a logic and arithmetic circuit including:
        means for determining a generally mixed-number division ratio m′ from a ratio of a desired output frequency FA and said frequency fr, where fa ideally is to equal FA and resolving said ratio m′ into a whole-number component mI which is applied to said divider to set the frequency divider ratio m thereof and a fractional component mF,
        means for forming a first sum S1 from said fractional component mF and another fractional component S1F derived by resolving said first sum S1 into said other fractional component S1F and a whole-number component S1I, and
        means for forming a second phase-error sum S2=S2I+S2F in the cadence of the output of said divider by adding the fractional component S1F′ resolved from said first sum of a preceding cycle period and a fractional component S2F′ resolved from said second sum in a preceding cycle period, said second sum being defined by S2=S1F′+S2F and being resolved into a second-sum fractional component S2F and a second-sum whole-number component S2I; and
    a phase shifter connected between said divider and said phase detector and controlled by said second-sum whole-number component S2I to compensate for said tendency and stabilize the output frequency of said oscillator.

2. A signal generator or synthesizer with digital frequency setting as defined in claim 1 wherein said phase shifter effects a delay of a pulse outputted by said divider by the fixed phase value S2I when the determined phase-error sum attains or exceeds said fixed phase value.

3. A signal generator or synthesizer with digital frequency setting as defined in claim 2 wherein a pulse appearing at the output of the divider will be delayed by p·Ta when the whole-number component S2I has the value p and the pulse appearing at the output of the divider is not delayed when S2I is zero, p being a whole number and Ta=1/fa.

4. A signal generator or synthesizer with digital frequency setting as defined in claim 3 wherein said phase shifter comprises a multistage shift register clocked in the cadence of said output frequency fa of the oscillator, and a reversing switch selectively commutating an input of said phase detector which communicates with said phase shifter to outputs of either of two stages of the shift register spaced apart by the value p, said logic and arithmetic unit being so connected to said reversing switch as to set the phase shifter to a lower value when the second or phase-error sum is less than the predetermined phase value p2π, and to set the phase shifter to a greater value increased by p2π over the lower value when the second sum S2 attains or exceeds the predetermined phase value.

5. A signal generator or synthesizer with digital frequency setting as defined in claim 3 wherein said logic and arithmetic unit, in order to delay a pulse delivered by the frequency divider to the input of the phase detector which normally has a frequency divider ratio m, has its frequency divider ratio mI or mI+1, as determined by the whole-number component S1I of the first sum S1, respectively once increased during the first of two successive period of the divider output frequency ft by one unit, and decreased during the second of these periods by one unit (mI+1 and mI−1 or mI+2 and mI).

6. A signal generator or synthesizer with digital frequency setting as defined in claim 3 wherein:
    a fractional component S1F′ of a said first sum S1′ extracted in the preceding cycle period is quantized with a step height b1 (S1F′=Q1I+Q1F=-Q1I+S1F mod b1), the second sum S2 is formed from a first step value Q1I and the fractional component S2F′ of the second sum S2′ extracted in a second cycle period,
    a first remainder Q1F is quantized with a step height b2 (Q1F=Q2I+Q2F=Q2I+Q1F mod b2), a third sum S3 is formed in the cadence of the output of the output pulses appearing at the output of the frequency divider from the second step value Q2I, the first remainder Q1F and a third mixed-number component S3F' resolved from the preceding cycle period and the third sum S3 thereof, and a third whole-number component S3I which also results from the resolution of the third sum S3 is used to form an analog voltage $U_{K1}$ proportional thereto and is supplied as a compensating voltage to said control input of the voltage-controlled oscillator together with a control voltage $U_{st}$ supplied thereto by said phase detector.

7. A signal generator or synthesizer with digital frequency setting as defined in claim 6 wherein:

a second remainder Q2F is quantized with a step height b3 (Q2F=Q3I+Q3F=Q3I+Q2F mod b3), a fourth sum S4 is formed in the cadence of the pulses appearing at the output of the frequency divider from the third step value Q3I, the second remainder or residue Q2F, and a fourth mixed-number component or fractional component S4F' which is formed in a preceding cycle period by resolving the fourth sum S4 into a fourth whole-number component S4I and a fourth fractional component S4F, and an analog voltage $U_{K2}$ is formed proportional to the fourth whole-number component S4I and is fed as a compensating voltage together with the analog voltage $U_{K1}$ and the control voltage $U_{st}$ to the control input of the oscillator.

8. A signal generator or synthesizer with digital frequency setting as defined in claim 7 wherein a control input of the frequency divider is supplied through an adder which can vary the divider ratio m among a multiplicity of values.

9. A signal generator or synthesizer with digital frequency setting as defined in claim 3 wherein said divider can be set selectively to a value m=mI and at a frequency-signal input to the divider a controllable pulse value adjuster is provided which is activated when the whole-number component S1I has the value p.

10. A signal generator or synthesizer with digital frequency setting as defined in claim 9 wherein said means for forming said first sum S1 includes a branching circuit for resolving said first sum S1 into said first whole-number component S1I and said first fractional component S1F, further comprising an intermediate storage unit connected between an output of said branching circuit at which said first fractional component S1F appears and an input of said pulse value adjuster, said intermediate storage unit being clocked at a cadence of output pulses from said divider at a frequency ft.

11. A signal generator or synthesizer with digital frequency setting as defined in claim 10 wherein said intermediate storage unit is a D-flipflop.

12. A signal generator or synthesizer with digital frequency setting as defined in claim 10 wherein said pulse value adjuster is a pulse subtractor.

13. A signal generator or synthesizer with digital frequency setting as defined in claim 9 wherein said means for forming said first sum S1 includes a branching circuit for resolving said first sum S1 into said first whole-number component S1I and said first fractional component S1F, further comprising an intermediate storage unit connected between an output of said branching circuit at which said first fractional component S1F appears and an adder connected to a ratio-selection input of said divider, said intermediate storage unit being clocked at a cadence of output pulses from said divider at a frequency ft.

14. A signal generator or synthesizer with digital frequency setting as defined in claim 13 wherein said intermediate storage unit is a D-flipflop.

15. A signal generator or synthesizer with digital frequency setting as defined in claim 13 wherein said pulse value adjuster is a pulse subtractor.

16. A signal generator or synthesizer with digital frequency setting as defined in claim 3, further comprising means for adding a constant value to said second sum.

17. A method of controlling a signal generator or synthesizer with digital frequency setting, comprising:

a voltage-controlled oscillator having an output emitting an output signal of a frequency fa controlled in response to a signal applied to a control input of said oscillator;

a loop filter connected to said control input for applying a signal thereto to control the output frequency fa of said oscillator;

a phase detector connected to said loop filter for supplying a control signal thereto for application to said control input, said phase detector having two inputs;

a reference-frequency source connected to one of said inputs of said phase detector for applying a high-precision reference frequency signal fr thereto;

a variable frequency divider ratio divider connected to said output and receiving said output signal of frequency fa therefrom and dividing said frequency fa by a variable frequency divider ratio m to provide a divided-frequency output which is applied to the other of said inputs of said phase detector, said frequency divider, said phase detector and said loop filter forming a phase-locked loop with said voltage-controlled oscillator, said phase detector having a tendency to sawtooth output fluctuations causing frequency drift of the oscillator, said method comprising the steps of:

determining a generally mixed-number division ratio m' from a ratio of a desired output frequency FA and said frequency fr, where fa ideally is to equal FA and resolving said ratio m' into a whole-number component mI which is applied to said divider to set the frequency divider ratio m thereof and a fractional component mF, forming a first sum S1 from said fractional component mF and another fractional component S1F' derived by resolving said first sum S1 into said other fractional component S1F and a whole-number component S1I, and forming a second phase-error sum S2=S2I+S2F in the cadence of the output of said divider by adding the fractional component S1F' resolved from said first sum of a preceding cycle period and a fractional component S2F' resolved from said second sum in a preceding cycle period, said second sum being defined by S2=S1F'+S2F and being resolved into a second-sum fractional component S2F and a second-sum whole-number component S2I, and controlling a phase shifter connected between said divider and said phase detector with said second-sum whole-number component S2I to compensate for said tendency and stabilize the output frequency of said oscillator.

18. The method defined in claim 17 wherein said phase shifter effects a delay of a pulse outputted by said divider by the fixed phase value S2I when the determined phase-error sum attains or exceeds said fixed phase value.

* * * * *